(12) United States Patent
Serizawa

(10) Patent No.: US 10,164,628 B2
(45) Date of Patent: Dec. 25, 2018

(54) SWITCH BOX

(71) Applicant: YAZAKI CORPORATION, Tokyo (JP)

(72) Inventor: Akira Serizawa, Shizuoka (JP)

(73) Assignee: YAZAKI CORPORATION, Minao-ku, Tokyo (JP)

( * ) Notice: Subject to any disclaimer, the term of this patent is extended or adjusted under 35 U.S.C. 154(b) by 414 days.

(21) Appl. No.: 14/933,138

(22) Filed: Nov. 5, 2015

(65) Prior Publication Data

US 2016/0134275 A1    May 12, 2016

(30) Foreign Application Priority Data

Nov. 6, 2014    (JP) .................................. 2014-226179

(51) Int. Cl.
| | |
|---|---|
| H02H 3/00 | (2006.01) |
| H03K 17/30 | (2006.01) |
| B60R 16/033 | (2006.01) |
| H02J 1/10 | (2006.01) |

(52) U.S. Cl.
CPC ........... *H03K 17/30* (2013.01); *B60R 16/033* (2013.01); *H02J 1/10* (2013.01)

(58) Field of Classification Search
USPC ........................................................ 361/84
See application file for complete search history.

(56) References Cited

U.S. PATENT DOCUMENTS

| | | | |
|---|---|---|---|
| 2002/0109952 A1* | 8/2002 | Rapsinski | H02H 9/042 361/86 |
| 2005/0156578 A1* | 7/2005 | Kamenoff | H02J 7/0034 320/165 |
| 2008/0238527 A1 | 10/2008 | Bolz et al. | |
| 2010/0208401 A1 | 8/2010 | Kimoto | |
| 2014/0268455 A1* | 9/2014 | Gofman | H02H 3/18 361/84 |
| 2016/0134275 A1* | 5/2016 | Serizawa | H03K 17/30 307/130 |

FOREIGN PATENT DOCUMENTS

| | | |
|---|---|---|
| JP | 09308095 A | 11/1997 |
| JP | 11146558 A | 5/1999 |
| JP | 2000060013 A | 2/2000 |
| JP | 2007082374 A | 3/2007 |
| JP | 2007507995 A | 3/2007 |
| JP | 2009-166769 A | 7/2009 |

(Continued)

OTHER PUBLICATIONS

Communication dated Nov. 8, 2016, issued by the Japan Patent Office in corresponding Japanese Application No. 2014-226179.

(Continued)

*Primary Examiner* — Ronald W Leja
(74) *Attorney, Agent, or Firm* — Sughrue Mion PLLC

(57) ABSTRACT

A switch box includes a relay transistor circuit connecting a pair of batteries in parallel, and an breaker circuit that breaks the relay transistor circuit when a sign of a potential difference between a potential of at least one of the pair of batteries connected to the relay transistor circuit and a predetermined reference potential is reversed with respect to the sign of the potential difference in which the batteries are correctly connected.

6 Claims, 2 Drawing Sheets

(56) References Cited

FOREIGN PATENT DOCUMENTS

| | | |
|---|---|---|
| JP | 2010044521 A | 2/2010 |
| JP | 2013255017 A | 12/2013 |
| JP | 2014-27799 A | 2/2014 |
| JP | 2014051956 A | 3/2014 |

OTHER PUBLICATIONS

Communication dated Apr. 3, 2018 from the Japanese Patent Office in counterpart Application No. 2017-019618.
Communication dated Jul. 3, 2018, from Japanese Patent Office in counterpart application No. 2017-019618.

* cited by examiner

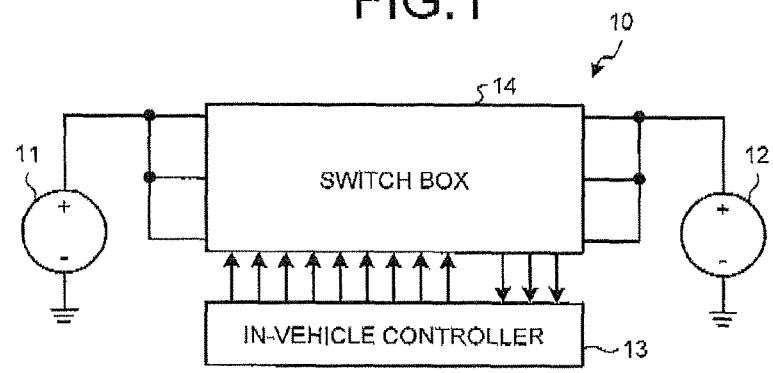
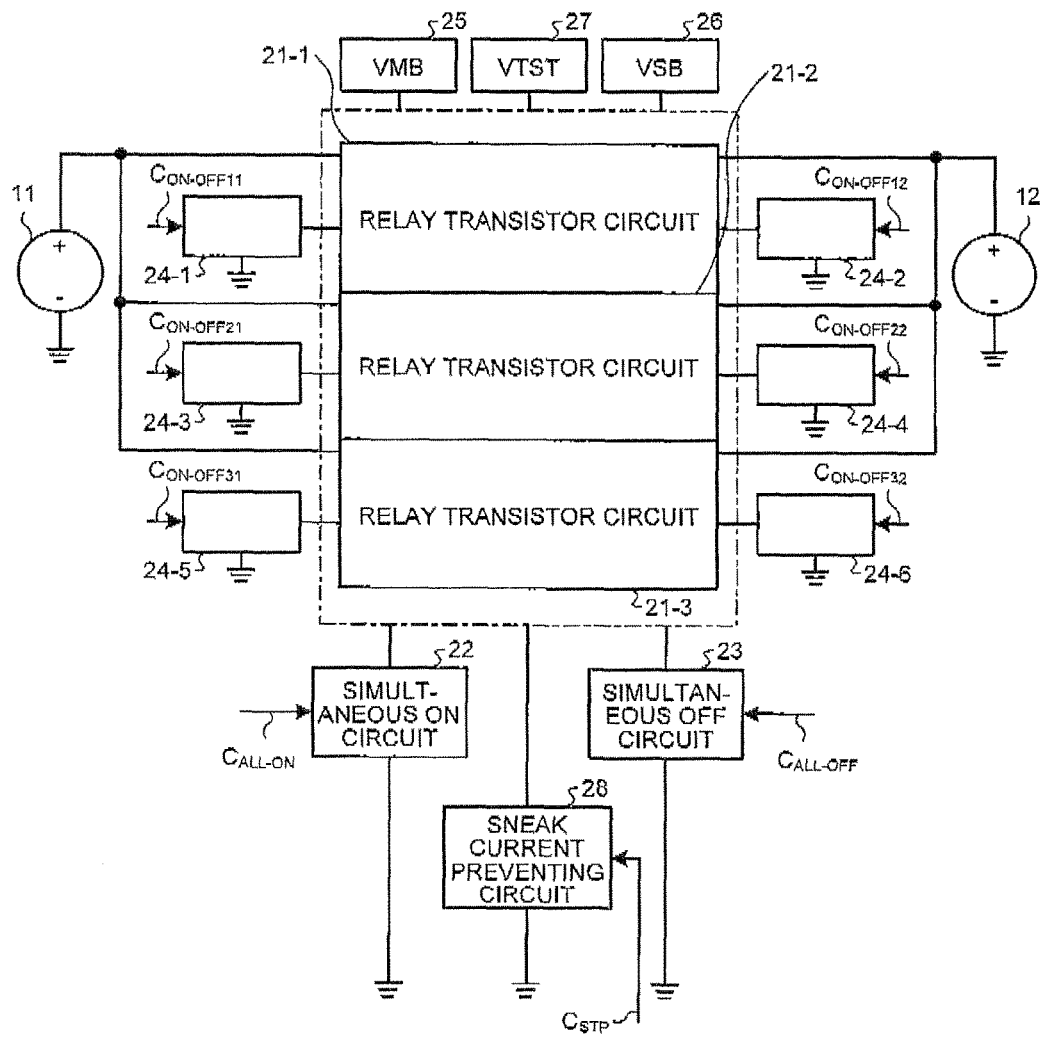

SWITCH BOX

CROSS-REFERENCE TO RELATED APPLICATION(S)

The present application claims priority to and incorporates by reference the entire contents of Japanese Patent Application No. 2014-226179 filed in Japan on Nov. 6, 2014.

BACKGROUND OF THE INVENTION

1. Field of the Invention

The present invention relates to a switch box.

2. Description of the Related Art

More devices in more fields have been electronized recently, and a plurality of secondary batteries are used as a power supply to satisfy the demand for a sufficient amount of electricity.

For example, provided to some automobiles is an in-vehicle power supply system using a lithium-ion battery as a sub-battery for supplying power to an in-vehicle equipment, such as an audio device, in addition to a lead storage battery serving as a main battery for driving the starter motor for starting the engine.

In addition to the demand for electricity, some other reasons for the use of the in-vehicle power supply system include the demands for improving the lifetime of devices and avoiding cost increase.

Lead storage batteries as the main battery, which are less expensive than the lithium-ion batteries as a sub-battery, are less durable against frequent charging/discharging. In particular, the lead storage battery deteriorates quickly due to frequent charging/discharging in, for example, vehicles with idling stop function, which stops the engine when the vehicles are stopping, or vehicles generating and storing electric power with an alternator using the regenerative energy of the vehicles.

Therefore, the less expensive lead storage battery is used in combination with the lithium-ion battery, which is more durable against frequent charging/discharging. The lithium-ion battery is preferentially used in operations requiring frequent charging/discharging, such as an operation of supplying power for a load during idling stop and regenerative charging, so that the lead storage battery deteriorates less. The lead storage battery is then used to store power for backup power supply for a long time period, for example, so as to avoid cost increase due to use of the lithium-ion battery, which has a small capacity. A related-art example is disclosed in Japanese Patent Application Laid-open No 2009-166769. In such an in-vehicle power supply system, when one of the main battery and the sub-battery is connected with its polarities reversed after a replacement, for example, a current may flow from a battery on the higher potential side to the other battery on the lower potential side (hereinafter, such a current is referred to as a reverse connection current).

This creates a need for a switch box that allows building of an in-vehicle power supply system in which such a reverse connection current flow can be prevented reliably.

SUMMARY OF THE INVENTION

The present invention is made in consideration of the above, and an object of the present invention is to provide a switch box capable of preventing the reverse connection current reliably when a battery is connected reversely.

In order to achieve the above mentioned object, a switch box according to one aspect of the present invention includes a relay transistor circuit configured to connect a pair of batteries in parallel; and a breaker circuit configured to break the relay transistor circuit when a sign of a potential difference between a potential of at least one of the pair of batteries connected to the relay transistor circuit and a predetermined reference potential is reversed with respect to the sign of the potential difference in which the batteries are correctly connected.

According to another aspect of the present invention, in the switch box, the relay transistor circuit may include a pair of N-channel MOSFETs having source terminals connected back to back, and the breaker circuit may include a short-circuiting circuit that short-circuits the source terminal and a gate terminal of each of the N-channel MOSFETs.

According to still another aspect of the present invention, in the switch box, the short-circuiting circuit may include a short-circuiting N-channel MOSFET connected serially between the source terminal and the gate terminal of each of the N-channel MOSFETs, and having a gate terminal set at the reference potential.

According to still another aspect of the present invention, the switch box may further include an off circuit configured to apply a high level voltage to the gate terminal of the short-circuiting N-channel MOSFET so as to switch off the N-channel MOSFETs included in the relay transistor circuit, based on an all-off control signal from outside.

According to still another aspect of the present invention, in the switch box, the reference potential may be set to a ground potential.

According to still another aspect of the present invention, in the switch box, the pair of N-channel MOSFETs may have gate terminals commonly connected, the relay transistor circuit may include a plurality of pairs of relay transistor circuits provided in parallel between the pair of batteries, and the short-circuiting circuit may be commonly connected to the N-channel MOSFETs included in each of the relay transistor circuits, and may short-circuit the source terminal and the gate terminal of each of the N-channel MOSFETs simultaneously.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 1 is a schematic block diagram of the configuration of an in-vehicle power supply system including a pair of in-vehicle batteries;

FIG. 2 is a schematic block diagram of the configuration of a switch box; and

DETAILED DESCRIPTION OF THE PREFERRED EMBODIMENTS

Figure 3:
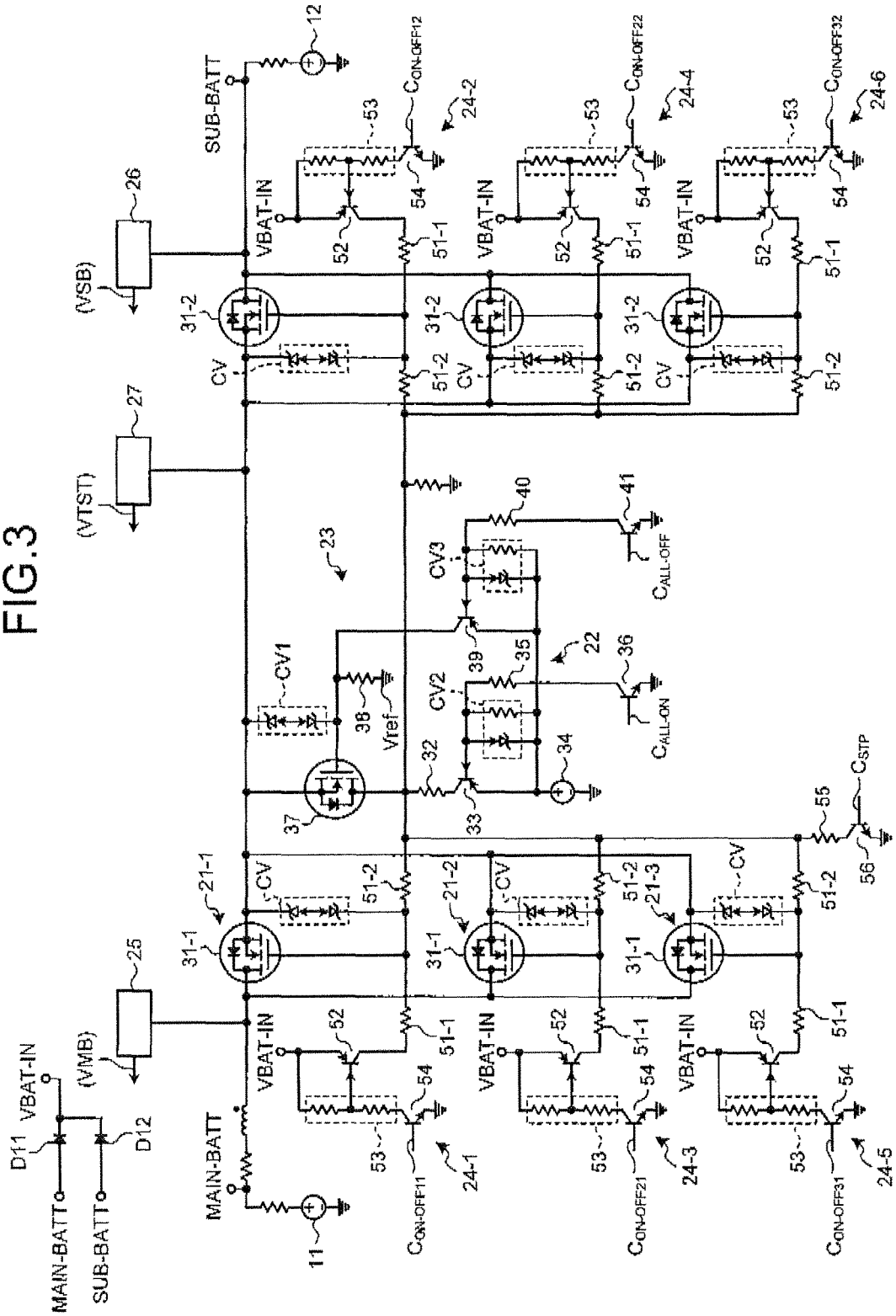
FIG. 3 is a detailed diagram for explaining an exemplary circuit of the switch box.

A preferred embodiment of the present invention will be explained with reference to the accompanying drawings.

FIG. 1 is a schematic block diagram of the configuration of an in-vehicle power supply system including a pair of in-vehicle batteries.

This in-vehicle power supply system 10 includes a main battery 11 that is a lead storage battery, a sub-battery 12 that is a lead storage battery, an in-vehicle controller 13 provided as, for example, an electronic control unit (ECU), and a switch box 14 including solid-state relays (SSRs) provided as relay transistor circuits performing operations such as parallel connection and disconnection of the main battery 11 and the sub-battery 12 under the control of the in-vehicle controller 13.

With such a configuration, the in-vehicle controller 13 in a test mode performs control to switch on or off each of a plurality of field-effect transistors (FETs) included in the switch box 14, and uses a resultant test voltage VTST to detect a short failure and an open failure in each of the FETs.

The in-vehicle controller 13 in a normal operation mode performs control to adjust a state of charge (SOC) of the main battery 11 or the sub-battery 12 to be within an appropriate range to prevent the main battery 11 and the sub-battery 12 from deteriorating quickly due to overcharge or overdischarge.

In other words, when the SOC of the main battery 11 falls below the appropriate range, the in-vehicle controller 13 promotes charging of the main battery 11 by setting a high voltage to the voltage of generated power that is adjusted by a regulator. When the SOC of the main battery 11 exceeds the appropriate range, the in-vehicle controller 13 promotes discharge of the main battery 11 by setting a low voltage to the voltage of generated power that is adjusted by the regulator.

It is normal for the open-circuit voltage of the main battery 11 to be different from that of the sub-battery 12. Therefore, if the main battery 11 and the sub-battery 12 are electrically connected, the set voltage of generation power may be adversely changed to keep the SOC of the main battery 11 within the appropriate range, which may cause overcharge or overdischarge of the sub-battery 12.

Therefore, when it is desirable to charge the main battery 11 but not the sub-battery 12, or it is not desirable to allow the power of the sub-battery 12 to be discharged into the main battery 11, the in-vehicle controller 13 instructs the switch box 14 to disconnect the main battery 11 from the sub-battery 12, or to keep these batteries disconnected.

FIG. 2 is a schematic block diagram of the configuration of the switch box.

The switch box 14 includes a plurality of (three, in FIG. 2) relay transistor circuits 21-1 to 21-3 that are connected in parallel, a simultaneous ON circuit 22 for switching all of the relay transistor circuits 21-1 to 21-3 ON simultaneously based on an all-ON control signal $C_{ALL\_ON}$ received from the in-vehicle controller 13, a simultaneous OFF circuit 23 for switching all of the relay transistor circuits 21-1 to 21-3 OFF simultaneously based on an all-OFF control signal $C_{ALL\_OFF}$ received from the in-vehicle controller 13, individual driving circuits 24-1 to 24-6 that are provided in pairs for the respective relay transistor circuits, a main voltage detecting circuit 25 that detects a voltage VMB of the main battery 11, a sub-voltage detecting circuit 26 that detects a voltage VSB of the sub-battery 12, and a test voltage detecting circuit 27 that detects the test voltage VTST in the test of the relay transistor circuits 21-1 to 21-3. The individual driving circuits 24-1 to 24-6 drive respective six N-channel metal-oxide semiconductor field-effect transistors (MOSFETs) included in the relay transistor circuits 21-1 to 21-3, which will be explained later, based on individual ON/OFF control signals $C_{ON\_OFF11}$, $C_{ON\_OFF12}$, $C_{ON\_OFF21}$, $C_{ON\_OFF22}$, $C_{ONOFF\_31}$, and $C_{ON\_OFF32}$, respectively, received from the in-vehicle controller.

The plurality of relay transistor circuits are provided in this example so as to distribute the current into these circuits and achieve a higher substantial electric capacity.

FIG. 3 is a detailed diagram for explaining an exemplary circuit of the switch box.

As illustrated in FIG. 3, each of the relay transistor circuits 21-1 to 21-3 includes N-channel MOSFETs 31-1 and 31-2 that are provided in pair and the source terminals of which are connected back to back. Constant voltage circuits CV for preventing a reverse-current flow are provided between the source terminal and the gate terminal of the N-channel MOSFET 31-1, and between the source terminal and the gate terminal of the N-channel MOSFET 31-2. In each of the constant voltage circuits CV, a pair of Zener diodes having their anodes connected to each other prevents a reverse current flow. The constant voltage circuits CV apply a predetermined constant voltage between the source terminal and the gate terminal of the N-channel MOSFET 31-1, or between these terminals of the N-channel MOSFET 31-2.

As illustrated in FIG. 3, the simultaneous ON circuit 22 includes a PNP transistor 33, a booster circuit 34, and an NPN transistor 36. The collector terminal of the PNP transistor 33 is connected to the gate terminals of the N-channel MOSFETs 31-1 and 31-2 provided in pair and included in the relay transistors, via a current restricting resistor 32. The booster circuit 34 is connected to the emitter terminal of the PNP transistor 33, and configured to apply an "H" (high) level voltage. The base terminal of the NPN transistor 36 receives an input of the all-ON control signal $C_{ALL\_ON}$ from the in-vehicle controller. The collector terminal of the NPN transistor 36 is connected to the base terminal of the PNP transistor 33 via a pull-down resistor 35. The emitter terminal of the NPN transistor 36 is grounded. The NPN transistor 36 drives the PNP transistor 33 based on the all-ON control signal $C_{ALL\_ON}$.

In the configuration described above, a constant voltage circuit CV2 is provided between the base terminal and the emitter terminal of the PNP transistor 33. The constant voltage circuit CV2 includes a Zener diode connected in parallel with a resistor, for keeping the voltage between the base terminal and the emitter terminal to a constant voltage while the PNP transistor 33 is ON state.

As illustrated in FIG. 3, the simultaneous OFF circuit 23 includes an N-channel MOSFET 37 for off-controlling, a pull-down resistor 38, a PNP transistor 39, and an NPN transistor 41. The source terminal of the N-channel MOSFET 37 is connected to the source terminals of the N-channel MOSFETs 31-1 and 31-2 in pair, and the drain terminal of the N-channel MOSFET 37 is connected to the gate terminals of the N-channel MOSFETs 31-1 and 31-2 in pair. The N-channel MOSFET 37 is configured to be switched ON to produce a short circuit between the source terminal and the gate terminal of each of these N-channel MOSFETs. The pull-down resistor 38 connects the gate terminal of the N-channel MOSFET 37 to a reference potential Vref (=0 volts). The PNP transistor 39 has its collector terminal connected to the connection point between the N-channel MOSFET 37 and the pull-down resistor 38, and has its emitter terminal connected to the booster circuit 34. The base terminal of the NPN transistor 41 receives an input of the all-OFF control signal $C_{ALL\_OFF}$ from the in-vehicle controller. The collector terminal of the NPN transistor 41 is connected to the base terminal of the PNP transistor 39 via a pull-down resistor 40, and the emitter terminal of the NPN transistor 41 is grounded. The NPN transistor 41 is configured to drive the PNP transistor 39 based on the all-OFF control signal $C_{ALL\_OFF}$.

In such a configuration, the N-channel MOSFET 37 and the pull-down resistor 38 serve as a breaker circuit that breaks the relay transistor circuits 21-1 to 21-3. The N-channel MOSFET 37 serves as short-circuiting circuit, that is, serves as a short-circuiting N-channel MOSFET for short-circuiting the source terminal and the gate terminal of each of the N-channel MOSFETs 31-1 and 31-2 included in the relay transistor circuits 21-1 to 21-3. With this configuration, the short-circuiting circuit is implemented solely with the N-channel MOSFET 37, thereby achieving a simple circuit configuration, and reliable break of the relay transistor circuits 21-1 to 21-3.

In addition, a constant voltage circuit CV1 for preventing a reverse current flow is provided between the source terminal and the gate terminal of the N-channel MOSFET 37. The constant voltage circuit CV1 includes a pair of Zener diodes the anodes of which are connected and that prevent a reverse current flow. The constant voltage circuit CV1 applies a predetermined constant voltage between the source terminal and the gate terminal of the N-channel MOSFET 37. A constant voltage circuit CV3 is provided between the base terminal and the emitter terminal of the PNP transistor 39 for keeping the voltage between the base terminal and the emitter terminal to the constant voltage while the PNP transistor 39 is ON state. The constant voltage circuit CV3 includes a Zener diode connected in parallel with a resistor.

The individual driving circuits 24-1 to 24-6 are configured to drive the N-channel MOSFETs included in the corresponding relay transistor circuits, and all have the same configuration. In the following, the individual driving circuit 24-1 will be explained as an example with reference to FIG. 3.

The individual driving circuit 24-1 includes a PNP transistor 52, a bias circuit 53, and an NPN transistor 54, as illustrated in FIG. 3.

In such a configuration, the collector terminals of all of the PNP transistors 52 in the respective individual driving circuits 24-1 to 24-6 are commonly connected to the collector terminal of an NPN transistor 56 via a pull-down resistor 55.

The base terminal of the NPN transistor 56 receives an input of a sneak-current preventing control signal $C_{STP}$ from the in-vehicle controller 13. The NFN transistor 56 is switched ON during the individual ON/OFF operation. The gate terminals of the N-channel MOSFETs 31-1 and 31-2 that are not to be controlled are grounded state ("L" (low) level) so that such N-channel MOSFETs 31-1 and 31-2 are not operated by the sneak current of the power for controlling the N-channel MOSFET 31-1 (or the N-channel MOSFET 31-2) being controlled. In order to prevent such a situation, the pull-down resistor 55 and the NPN transistor 56 serve as a sneak current preventing circuit 28.

These individual driving circuits 24-1 to 24-6 and the sneak current preventing circuit 28 are used in testing the operations of the individual N-channel MOSFETs 31-1 and 31-2 included in the relay transistor circuits 21-1 to 21-3.

Operations according to the embodiment will be explained.

[1] All-ON Operation

To begin with, an all-ON operation in which all of the N-channel MOSFETs 31-1 and 31-2 included in the relay transistor circuits 21-1 to 21-3 are switched ON will be explained.

At an initial state, all of the N-channel MOSFETs 31-1 and 31-2 included in the relay transistor circuits 21-1 to 21-3 are all OFF state. The source terminal of each of the N-channel MOSFETs 31-1 and the source terminal of the corresponding N-channel MOSFET 31-2 are connected back to back, and because their parasitic diodes are oriented in opposite directions, the main battery 11 and the sub-battery 12 are not connected.

The in-vehicle controller 13 then sets the all-ON control signal $C_{ALL\_ON}$ to the "H" level.

This signal causes the NPN transistor 36 to be ON, and the pull-down resistor 35 brings the potential at the base terminal of the PNP transistor 33 to the ground level, and the PNP transistor 33 is switched ON.

As a result of this operation, the "H" level voltage (=20 volts) of the booster circuit 34 is applied to the gate terminal of the N-channel MOSFET 31-1 and the gate terminal of the N-channel MOSFET 31-2 included in the relay transistor circuits 21-1 to 21-3, thereby switching all of the N-channel MOSFETs 31-1 and 31-2 to be ON (closed state).

The main battery 11 and the sub-battery 12 are thus connected in parallel via the relay transistor circuits 21-1 to 21-3, and supply power integrally.

[2] All-OFF Operation

An all-OFF operation in which all of the N-channel MOSFETs 31-1 and 31-2 included in the relay transistor circuits 21-1 to 21-3 are switched OFF will be explained.

It is assumed that, at an initial state, the N-channel MOSFETs 31-1 and 31-2 included in the relay transistor circuits 21-1 to 21-3 are all ON state.

The in-vehicle controller 13 sets the all-ON control signal $C_{ALL\_ON}$ to the "L" level, switching the NPN transistor 36 and the PNP transistor 33 OFF thereby. The in-vehicle controller 13 then sets the all-OFF control signal $C_{ALL\_OFF}$ to the "H" level.

This signal causes the NPN transistor 41 to be ON. The pull-down resistor 4C brings the potential of the base terminal of the PNP transistor 39 to the ground level, and the PNP transistor 39 is switched ON.

As a result of this operation, the "H" level voltage of the booster circuit 34 is applied to the gate terminal of the N-channel MOSFET 37.

The N-channel MOSFET 37 is then switched ON, and the potential of the source terminals and the gate terminals of all of the N-channel MOSFETs 31-1 and 31-2 included in the relay transistor circuits 21-1 to 21-3 are brought to the same level, and all of the N-channel MOSFETs 31-1 and 31-2 are switched OFF.

In this manner, the parallel connection between the main battery 11 and the sub-battery is broken by the relay transistor circuits 21-1 to 21-3.

[3] Operation when Battery is Connected with Polarity Reversed

An operation with a battery connected with its polarity reversed will be explained.

[3.1] Operation with Reversely Connected Main Battery

To begin with, at an initial state, it is assumed that the N-channel MOSFETs 31-1 and 31-2 included in the relay transistor circuits 21-1 to 21-3 are all OFF state, and the main battery 11 and the sub-battery 12 are disconnected.

In such a configuration, because the cathode terminal of a diode D11 in the main battery 11 is connected with the cathode terminal of a diode D12 in the sub-battery 12, as illustrated in FIG. 3, no current will flow from the sub-battery 12 being the high-potential side (e.g., +12 volts) into the main battery 11 being the low-potential side (e.g., −12 volts) unless the N-channel MOSFETs 31-1 and 31-2 are switched ON (closed state).

The potentials of the gate terminals of the N-channel. MOSFETs 31-1 and 31-2 are at the ground level.

When the main battery 11 is reversely connected, the source terminals of the N-channel MOSFETs 31-1 and 31-2 are brought to the potential equal to the sum of the drop voltage Vf of the parasitic diode of the N-channel MOSFET 31-1 and the potential of the main battery 11 (e.g., −12+Vf [V]).

As a result, the N-channel MOSFETs 31-1 and 31-2 shift to the ON state (closed state). In other words, some current may flow from the sub-battery 12 into the main battery 11 (or from the main battery 11 into the sub-battery 12).

The potential of the gate terminal of the N-channel MOSFET 37 is at the reference potential Vref (=0 volts: ground potential) due to the presence of the pull-down resistor 38. This ensures that, when at least one of the main battery 11 and the sub-battery 12 is reversely connected, the sign of the difference between the potential of the reversely connected battery and the predetermined reference potential Vref is reversed with respect to the difference achieved when the battery is correctly connected.

In other words, the potential of the source terminal of the N-channel MOSFET 37 drops lower than the gate potential of the N-channel MOSFET 37, and the "H" level signal becomes applied to the gate terminal of the N-channel MOSFET 37.

The N-channel MOSFET 37 is then caused to shift to the ON state. The source terminal and the gate terminal of each of the N-channel MOSFETs 31-1 and 31-2 included in the relay transistor circuits 21-1 to 21-3 are short-circuited and brought to substantially the same potential, and therefore, the N-channel MOSFETs 31-1 and 31-2 shift to the OFF state.

As a result of this operation, the relay transistor circuits 21-1 to 21-3 are all switched OFF, and prevent a current from flowing from the sub-battery 12 being the high-potential side (e.g., +12 volts) into the main battery 11 being the low-potential side (e.g., −12 volts).

[3.2] Operation with Reversely Connected Sub-Battery

It is now assumed that, at an initial state, all of the N-channel MOSFETs 31-1 and 31-2 included in the relay transistor circuits 21-1 to 21-3 are CFF, and the main battery 11 and the sub-battery 12 are disconnected.

In such a configuration, because the cathode terminal of the diode D11 is connected with the cathode terminal of the diode D12, as illustrated in FIG. 3, no current will flow from the sub-battery 12 being the high-potential side (e.g., +12 volts) into the main battery 11 being the low-potential side (e.g., −12 volts).

The potentials of the gate terminals of the N-channel MOSFETs 31-1 and 31-2 are at the ground level.

When the sub-battery 12 is reversely connected, the potentials of the source terminals of the N-channel MOSFETs 31-1 and 31-2 are brought to the potential equal to the sum of the drop voltage Vf of the parasitic diode of the N-channel MOSFET 31-2 and the potential of the sub-battery 12 (e.g., −12+Vf [V]).

As a result, the N-channel MOSFETs 31-1 and 31-2 shift to the ON state (closed state).

The potential of the source terminal of the N-channel MOSFET 37 is brought to the potential equal to the sum of the drop voltage Vf of the parasitic diode of the N-channel MOSFET 31-2 and the potential of the sub-battery 12 (e.g., −12+Vf [V]).

The potential of the gate terminal of the N-channel MOSFET 37 is at the reference potential Vref (=0 volts: ground potential) due to the presence of the pull-down resistor 38.

In other words, the potential of the source terminal of the N-channel MOSFET 37 drops lower than the gate potential of the N-channel MOSFET 37, and the "H" level signal becomes applied to the gate terminal of the N-channel MOSFET 37.

The N-channel MOSFET 37 is then caused to shift to the ON state. The source terminal and the gate terminal of each of the N-channel MOSFETs 31-1 and 31-2 included in the relay transistor circuits 21-1 to 21-3 are then short-circuited and are brought to substantially the same potential, and therefore, the N-channel MOSFETs 31-1 and 31-2 shift to the OFF state.

As a result of this operation, the relay transistor circuits 21-1 to 21-3 are all switched OFF, and prevent a current from flowing from the main battery 11 being the high-potential side (e.g., +12 volts) into the sub-battery 12 being the low-potential side (e.g., −12 volts).

[3.3] Operation with Main Battery and Sub-Battery Both Connected Reversely

In this example as well, the potential of the source terminal of the N-channel MOSFET 37 is brought to the potential equal to the sum of the drop voltage Vf of the parasitic diode in the N-channel MOSFET 31-2 and the potential of the main battery 11 or the sub-battery 12 whichever having a lower potential, in the same manner as in the examples described above. For example, when the potential of the main battery 11 is −12.2 volts, and the potential of the sub-battery 12 is −12.1 volts, the potential of the source terminal of the N-channel MOSFET 37 is brought to the potential equal to the sum of the drop voltage Vf of the parasitic diode in the N-channel MOSFET 31-2 and the potential of the main battery 11 (=−12.2 volts+Vf).

Because the potential of the gate terminal of the N-channel MOSFET 37 is at the reference potential Vref (=0 volts: ground potential) due to the presence of the pull-down resistor 38, the potential of the source terminal of the N-channel MOSFET 37 becomes sufficiently lower than the gate potential of the N-channel MOSFET 37, and the "a" level signal becomes applied to the gate terminal of the N-channel MOSFET 37.

Therefore, the N-channel MOSFET 37 shifts to the ON state, and the source terminal and the gate terminal of each of the N-channel MOSFETs 31-1 and 31-2 included in the relay transistor circuits 21-1 to 21-3 are short-circuited and brought to substantially the same potential, and therefore, the N-channel MOSFETs 31-1 and 31-2 shift to the OFF state.

As a result of this operation, the relay transistor circuits 21-1 to 21-3 are all switched OFF, and prevent a current from flowing from the battery being the high-potential side into the battery being the low-potential side.

Furthermore, because the N-channel MOSFET 37 is used in the operation with a reversely connected battery, as well as in the all-OFF operation as explained so far, the number of components can be reduced compared with when these operations are implemented using separate circuits.

As described above, the switch box 14 according to the embodiment prevents the main battery 11 and the sub-battery 12 from being connected, even when at least one of the main battery 11 and the sub-battery 12 is connected with its polarities reversed with respect to those in the correct orientation of the battery. Because no reverse connection current flows from the battery being the high-potential side into the other battery being the low-potential side, the switch box can achieve an in-vehicle power supply system in which the reverse connection current can be prevented reliably.

The present invention is explained above based on the embodiment, but the embodiment is merely exemplary, and it should be clear for those skilled in the art that various modifications of these elements and the combinations of the elements are still possible, and are within the scope of the present invention.

For example, the main battery 11 and the sub-battery 12 are explained to be lead storage batteries in the explanation above, but the same configuration can be used even when at least one of these batteries is a secondary battery of any other type, e.g., a lithium-ion battery, as long as they both have the same rated output voltage.

Furthermore, although the main battery 11 and the sub-battery 12 are explained above to be provided as one secondary battery, at least one of these batteries may be provided as an assembled battery including a plurality of batteries that are serially or parallely connected and serving as one battery.

Furthermore, although the reference potential Vref that is the potential of the gate terminal of the N-channel MOSFET 37 is explained above to be the ground potential (=0 volts), the reference potential Vref does not necessarily need to be the ground potential, and may be any other potential as long as the sign of the difference between the potential of at least one of the main battery 11 and the sub-battery 12 and the reference potential Vref is reversed with respect to the sign of the difference with the batteries correctly connected.

With the switch box according to the embodiment, even when a battery is connected with its polarity reversed in a system in which a pair of batteries are connected in parallel, a reverse connection current flow from one of the batteries an the high-potential side to the other battery on the low-potential side can be prevented reliably.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A switch box comprising:
    a relay transistor circuit configured to connect a pair of batteries in parallel; and
    a breaker circuit configured to break the relay transistor circuit when a sign of a potential difference between a potential of at least one of the pair of batteries connected to the relay transistor circuit and a predetermined reference potential is reversed with respect to the sign of the potential difference in which the batteries are correctly connected,
    wherein the relay transistor circuit includes a pair of N-channel MOSFETs having source terminals connected back to back,
    wherein the breaker circuit includes a short-circuiting circuit that short-circuits the source terminal and a gate terminal of each of the N-channel MOSFETs, and
    wherein the short-circuiting circuit includes a short-circuiting N-channel MOSFET connected serially between the source terminal and the gate terminal of each of the N-channel MOSFETs, and having a gate terminal set at the reference potential.

2. The switch box according to claim 1, further comprising:
    an off circuit configured to apply a high level voltage to the gate terminal of the short-circuiting N-channel MOSFET so as to switch off the N-channel MOSFETs included in the relay transistor circuit, based on an all-off control signal from outside.

3. The switch box according to claim 2, wherein
the reference potential is set to a ground potential.

4. The switch box according to claim 2, wherein
the pair of N-channel MOSFETs have gate terminals commonly connected, and
the short-circuiting circuit is commonly connected to the N-channel MOSFETs included in each of the relay transistor circuits, and short-circuits the source terminal and the gate terminal of each of the N-channel MOSFETs simultaneously.

5. The switch box according to claim 1, wherein
the reference potential is set to a ground potential.

6. The switch box according to claim 1, wherein
the pair of N-channel MOSFETs have gate terminals commonly connected,
the relay transistor circuit includes a plurality of pairs of relay transistor circuits provided in parallel between the pair of batteries, and
the short-circuiting circuit is commonly connected to the N-channel MOSFETs included in each of the relay transistor circuits, and short-circuits the source terminal and the gate terminal of each of the N-channel MOSFETs simultaneously.

* * * * *